United States Patent [19]

Muramatsu et al.

[11] Patent Number: 4,908,078
[45] Date of Patent: Mar. 13, 1990

[54] MATERIAL FOR CONDUCTIVE PARTS OF ELECTRONIC OR ELECTRIC DEVICES

[75] Inventors: Toshiki Muramatsu; Mamoru Matsuo; Shigeo Tsuchida, all of Fukaya; Hiroyoshi Gungi, Tsuchiura, all of Japan

[73] Assignee: Sky Aluminium Co., Ltd., Tokyo, Japan

[21] Appl. No.: 207,310

[22] PCT Filed: Oct. 8, 1987

[86] PCT No.: PCT/JP87/00758
§ 371 Date: May 27, 1988
§ 102(e) Date: May 27, 1988

[87] PCT Pub. No.: WO88/02788
PCT Pub. Date: Apr. 21, 1988

[30] Foreign Application Priority Data

Oct. 9, 1986 [JP] Japan ................... 81-240713

[51] Int. Cl.⁴ .............................................. C22C 21/00
[52] U.S. Cl. ..................................... 148/439; 148/440
[58] Field of Search ............... 420/531, 532, 533, 541, 420/542, 543; 148/439, 440

[56] References Cited

FOREIGN PATENT DOCUMENTS

| | | |
|---|---|---|
| 50-106106 | 8/1975 | Japan . |
| 58-124235 | 7/1983 | Japan . |
| 61-136653 | 6/1986 | Japan . |
| 62-96638 | 5/1987 | Japan . |
| 62-96642 | 5/1987 | Japan . |
| 62-130254 | 6/1987 | Japan . |

*Primary Examiner*—R. Dean
*Attorney, Agent, or Firm*—Oliff & Berridge

[57] ABSTRACT

Herein disclosed is a material for making conductive parts such as lead frames or connectors of semiconductor elements or integrated circuits (i.e., ICs). The material is an aluminum-based alloy containing 0.3 to 4.0 wt. % of manganese and 0.10 to 5.0 wt. % of magnesium, the remainder being aluminum and unavoidable impurities. The material may additionally contain: at least one of copper and zinc; and/or at least one of chromium, zirconium, vanadium and nickel, if necessary. The material having the composition specified above can be made at a reasonable cost with excellent softening resistance, electric and thermal conductivities, solderability and platability, a high mechanical strength, and an excellent bending repeatability.

15 Claims, No Drawings

MATERIAL FOR CONDUCTIVE PARTS OF ELECTRONIC OR ELECTRIC DEVICES

TECHNICAL FIELD

The present invention relates to a material for conductive parts such as lead frames, connectors or switches of semiconductor elements or ICs (i.e., Integrated Circuits) and, more particularly, to a material for conductive parts of an electronic or electric device, which can exhibit excellent softening resistance, electric conductivity, thermal conductivity (or radiatability), solderability and platability, a high mechanical strength, and an excellent bending repeatability.

BACKGROUND TECHNIQUE

The conductive parts to be used in an electronic or electric device are represented by a lead frame which is used in a semiconductor unit such as a transistor, an IC, an LSI (i.e., Large Scale Integration), an SCR (i.e., Silicon Controlled Rectifier: a thyristor). This lead frame is mounted in the IC or semiconductor element by a process having the following steps.

First of all, a strip of a conductive material having a thickness of 0.1 to 0.5 mm is prepared as the material for the lead frame. This strip is pressed or etched into a desired lead frame shape (having its outer leads united). Then, a semiconductor element (e.g., a Si (silicon) chip) made of highly pure Si is bonded to a predetermined portion of that lead frame. This is called the "die-bonding" step, which is exemplified by: the press bonding using a conductive resin such as Ag (silver) paste; the method of bonding the lead frame and the semiconductor element by preforming a plating layer composed of one lamina or two or more laminas of Au (gold), Ag or Ni (nickel) and by thermally diffusing and bonding through that plating layer to form an eutectic of Au - Si; or the bonding method using solder of Pb (lead) - Sn (tin). After this, the Al (aluminum) electrodes over the semiconductor element (e.g., Si chip) bonded to the predetermined portion of the lead frame mounted on the substrate are connected to the conductor terminals (i.e., inner leads) of the lead frame through Au or Al wires. Subsequently, the semiconductor element, the connecting portions and the lead frame, in which the semiconductor element is mounted, are sealed with a resin or ceramics so that they may be protected. At last, the mutually united portions of the outer leads of the lead frame are cut away.

The lead frame material to be manufactured by the process described above is required to have an excellent pressability or etchability; excellent heat (or softening) resistance, platability and solderability at the step of die-bonding the semiconductor chip (e.g., Si chip) and the lead frame; excellent radiatability (or thermal conductivity) and electric conductivity; strength and ductility sufficient for being free from any breakage even if the semiconductor device is bent one or many times when it is to be transported or mounted in an electric device; and corrosion resistance.

The lead frame materials used in the prior art are the 42 alloy of Fe (iron) - Ni (42 %); the alloy of Fe - Co (cobalt) (17 %) - Ni (29 %), which is known under the trade name of "Koval"; phosphor bronze (e.g., CA 501) of Cu (copper) system alloy; Cu - Fe - Zn (zinc) - P (phosphor) alloy (e.g., CA194); Cu - Fe - Co - Sn - P alloy (e.g., CA 195); and so on.

Of the above-enumerated lead frame materials, however, both the Koval and the 42 alloy contain large percentages of expensive Ni so that they have to become expensive, whereas the Cu system alloys are inferior in the bending repeatability and are troubled in their production costs. It is, therefore, earnestly desired for the conductive material for the conductive parts of an electronic or electric device and represented by the lead frame material to satisfy the several properties required thereof and to be developed and practiced at reasonable costs.

Generally speaking, aluminum alloys are known as the conductive materials produced at reasonable costs. In the prior art, however, the aluminum alloys are accepted not to sufficiently meet the aforementioned several properties required of the lead frame and so on. Thus, the fact is that the lead frame materials of the aluminum alloys are not practically used.

The present invention has been conceived in view of the background described above and has an object to provide a material for conductive parts of an electronic or electric device, which is made of an inexpensive aluminum-based alloy and which has excellent softening resistance, electric conductivity, thermal conductivity (or radiatability), solderability and platability, high mechanical strength, and excellent bending repeatability.

DISCLOSURE OF THE INVENTION

We have conducted various experiments and investigations on what components and compositions of an aluminum-based alloy could satisfy the properties required of the materials to be used for the conductive parts of an electronic or electric device such as the aforementioned lead frame. After these experiments and investigations, we have found that an Al - Mn (manganese) - Mg (magnesium) system alloy within a composition range to be specified herein could satisfy the aforementioned several properties, and have conceived the present invention.

According to a first mode of the present invention, there is provided a material for conductive parts of an electronic or electric device, which material contains: 0.3 to 4.0% (in weight, the rest being the same as above) of manganese, and 0.10 to 5.0% of magnesium, the remainder being aluminum and unavoidable impurities.

According to a second mode of the present invention, there is provided a material for conductive parts of an electronic or electric device, which material contains, in addition to the Mn and Mg specified in the first mode, at least one of 0.01 to 3.0% of copper and 0.01 to 3.0% of zinc.

According to a third mode of the present invention, there is provided a material for conductive parts of an electronic or electric device, which material contains, in addition to the Mn and Mg specified in the first mode, at least one of 0.01 to 0.30% of Cr (chromium), 0.01 to 0.30% of Zr (zirconium), 0.01 to 0.30% of V (vanadium), and 0.01 to 5.7% of Ni.

According to a fourth mode of the present invention, there is provided a material for conductive parts of an electronic or electric device, which material contains, in addition to the Mn and Mg specified in the first mode: at least one of the Cu and Zn specified in the second mode; and at least one of the Cr, Zr, V and Ni specified in the third mode.

The reasons for defining the components of the material for conductive parts of an electronic or electric device, which is made of the aluminum-based alloy according to the present invention, will be described in the following.

Mn:

Mn is an element which is effective for improving the strength and heat resistance and is essential for ensuring the strength, bending repeatability and softening resistance necessary for parts such as the lead frame. The percentage of Mn less than 0.3% will not give those effects sufficiently whereas the percentage of more than 4.0% will make it difficult to manufacture the alloy of the present invention and it is liable to form coarse crystallites and will saturate the heat resisting effect to invite a useless cost rise. Thus, Mn is defined to fall within the range of 0.3 to 4.0%. Here, the percentage of Mn exceeding 1.2% within this range is preferable from the standpoint of improving the strength, bending repeatability and softening resistance.

Mg:

Mg is an element which is also effective for improving the strength and is added together with Mn so as to ensure the sufficient strength and bending repeatability necessary. The percentage of Mg less than 0.10% will not give the strength improving effect sufficiently whereas the percentage of more than 5.0% will seriously drop the rollability. Thus, Mg is defined to fall within the range of 0.10 to 5.0%. Here, the percentage of Mg short of 3.0% is preferable from the standing point of the rollability.

The aluminum alloy or the material for the conductive parts of an electronic or electric device according to the present invention can basically retain the several properties necessary for the parts such as the lead frame if it contains the Mn and Mg defined above. In order to improve the properties better, however, the second and fourth modes of the present invention contain Cu and/or Zn, and the third and fourth modes additionally contain at least one of Cr, Zr, V and Ni. The reasons for adding and defining these elements will be described in the following.

Cu:

Cu is an element which is effective for improving the platability and solderability of the alloy better. The percentage of less than 0.01% will not ensure this effect sufficiently whereas the percentage of more than 3.0% will drop the corrosion resistance of the alloy. Thus, Cu is defined to fall within the range of 0.01 to 3.0%. Here, in the case of Cu audition, the work hardening and age hardening are intensified to contribute to the improvement in strength if the conditions for heat treatment are properly controlled in the manufacturing process.

Zn:

Zn is an element which is also effective for improving the platability and solderability of the alloy better. The percentage of Zn less than 0.01% will not ensure this effect sufficiently whereas the percentage of more than 3.0% will drop the corrosion resistance of the alloy. Thus, Zn is defined to fall within the range of 0.01 to 3.0%. Here, in the case of Zn addition, the work hardening and age hardening are intensified to contribute to the improvement in strength if the conditions for heat treatment are properly controlled in the manufacturing process.

Cr, Zr, V and Ni:

These elements are effective for improving the strength and heat resistance. The percentages of Cr, Zr, V and Ni less than 0.01%, 0.01%, 0.01% and 0.01% respectively, will not ensure these effects sufficiently whereas the percentages of Cr, Zr, V and Ni of more than 0.30%, 0.30%, 0.30% and 5.7% will saturate the same effects and form huge compounds when in a casting. Thus, Cr, Zr, V and Ni are defined to fall within the ranges of 0.01 to 0.30%, 0.01 to 0.30%, 0.01 to 0.30%, and 0.01 to 5.7%, respectively.

The remainder other than the above-defined components may be Al and unavoidable impurities which usually involve Fe and Si (silicon). The percentages of Fe less than about 0.60% and Si less than about 0.50% will not raise a serious trouble with the material for the conductive parts of an electronic or electric device such as the lead frame, to which is directed the present invention.

When in manufacturing an aluminum alloy ingot, generally speaking, it frequently occurs to add Ti (titanium) or Ti and B (boron) so as to refine the ingot grain. In the case of the material of the present invention, too, the addition of Ti or Ti and B will not raise a serious trouble with the material for the conductive parts of an electronic or electric device. However, the amount of addition is desired to be less than 0.2% for Ti and less than 0.04% for B.

When an Al alloy containing Mg like the aluminum-based alloy of the system of the present invention is to be cast, on the other hand, Be (beryllium) is sometimes added, if necessary, so as prevent oxidation of the molten metal or improve the rollability. In the case of the material of the present invention, too, 50 ppm or less of Be can be added, if necessary.

Since the material for the conductive parts of an electronic or electric device according to the present invention has the aluminum-based alloy having the components and compositions thus far defined, it is far more inexpensive than the 42 alloy, Koval or Cu system alloy of the prior art and has excellent softening resistance, electric conductivity, thermal conductivity, radiatability, solderability, platability, mechanical strength and bending repeatability. Hence, the material of the present invention finds its most proper application to the material for the conductive parts of an electronic or electric device, such as the lead frames, switches or connectors of ICs or semiconductor elements, all of which are required to have the above-specified properties. If the material of the present invention is to be applied to a lead frame in case this lead frame is wire-bonded with Al wires, the lead frame need not be plated with Au or Ag at its portions for mounting the semiconductor elements or wires. This raises another merit that the cost for fabricating the semiconductor elements can be further dropped.

MANUFACTURING PROCESS

The process for manufacturing the aluminum-based alloy as the material for the conductive parts of an electronic or electric device according to the present invention will be described in detail in the following.

First of all, the molten metal of the aluminum-based alloy having one of the above-specified components and compositions is cast by an ordinary method. This casting method is usually the semi-continuous (or direct chill) casting but may desirably be exemplified by the sheet continuous casting (or continuous casting/rolling) a thin strip of about 3 to 15 mm directly, from the standpoint of saving the energy and improving the strength, e.g., the softening resistance.

The ingot prepared by the semi-continuous casting is subjected to a soaking treatment (or homogenized) and hot-rolled, and, if necessary, cold-rolled, intermediate-annealed and finally cold-rolled into a rolled strip having a thickness of about 0.1 to 0.5 mm. Incidentally, in the case of the sheet continuous cast strip, the steps up to the hot-rolling can be omitted.

Of the aforementioned steps, the soaking treatment may hold the ingot at 450° to 600° C. within 48 hrs. The heating temperature lower than 450° C. will drop the hot rollability whereas the temperature higher than 600° C. will cause the eutectic melting. On the other hand, the holding time longer than 48 hrs will substantially saturate the homogenizing effect of the structure due to the soaking treatment only to invite a rise in the energy cost.

After this soaking treatment, the ingot is usually reheated before it is hot-rolled. This reheating may be accomplished at 400° to 550° C. as usual, and the hot-rolling may also be accomplished at the same temperature. Here, the soaking treatment (or homogenization) and the heat treatment for the hot-rolling need not be so separately conducted above, but one heat treatment may be conducted for the homogenization and hot-rolling, followed by the hot-rolling.

After this hot-rolling the ingot is, if necessary, primary cold-rolled, and, if necessary, intermediate-annealed (for the solution heat treatment) and finally cold-rolled.

Here, the intermediate-annealing is accomplished to improve the rollability, or to enhance, in the case of a Zn or Cu added alloy, both the work hardening due to a subsequent cold rolling and the age hardenability. For preventing the edge crack during the rolling or for improving the rollability, either a continuous annealing (at heating and cooling rates of several tens °C./sec) or a batch annealing (at heating and cooling rates of several tens °C./sec) may be accepted, and the annealing temperature may be at about 300° to 450° C. In case the intermediate annealing is used to enhance the work hardenability or ensure the age hardenability of an alloy containing Zn or Cu, it is necessary to dissolve Mg and Zn or Cu in a solid state into Al. For these purposes, the intermediate annealing may be accomplished under the conditions following those for the solution heat-treatment of the ordinary 2000 system alloy or 7000 system alloy. Specifically, the annealing temperature is within 480° to 560° C., at which is held the ingot within 1 hr depending upon the thickness, and the ingot is then cooled at a rate of 1 °C./sec or higher. This cooling rate is desirably selected because the ingot is less hardened due to the aging and has a low work hardening if the rate is lower than 1 °C./sec. Incidentally, if a coil is intermediate-annealed, a continuous annealing furnace is used. In this case, however, substantially no holding time will not seriously deteriorate the later age hardening and work hardening.

The final cold rolling is necessary not only for giving a desired thickness but also for improving the strength by the work hardening. The final rolled strip is required to have a tensile strength of 30 Kgf/mm² or higher and a yield strength of 25 Kgf/mm² or higher as the material for the conductive parts of an electronic or electric device such as the lead frame. The aluminum-based alloy of the present invention can retain those values sufficiently as the strength of the cold rolled strip. If the above-specified strength can be retained, a final annealing at the temperature of 100° C. or higher may be accomplished after the final cold rolling so as to improve the bending repeatability better. In case, on the other hand, the age hardenability is given by the intermediate annealing, the aging treatment can also be attained at about 100° to 250° C. to improve the strength.

BEST MODE FOR CARRYING OUT THE INVENTION

The alloys of the present invention and the comparison alloy, as enumerated in Table 1, were manufactured by the ordinary semi-continuous casting method or sheet continuous casting (or continuous casting/rolling) method. The semi-continuous cast ingots were scalped to have a thickness of 300 mm, a width of 1,000 mm and a length of 3,500 mm and were rolled to have a thickness of 0.30 mm under the condition No. 1, as enumerated in Table 2. In the case of the continuous casting, the cast plates had a thickness of 4 or 5 mm and were rolled to have a thickness of 0.30 mm under the conditions Nos. 2 and 3, as enumerated in Table 2. As to these rolled strips of the aluminum-based alloy, the mechanical properties, the softening resistance, the conductivity, the platability and the solderability were investigated. The results are enumerated in Table 3.

Here, the mechanical properties were investigated on the rolled strips.

Generally speaking, in case the Pb - Sn solder is used for die-bonding the lead frame, the heat treatment is conducted in an inert gas at 200° to 300° C. for several seconds. Moreover, in the die-bonding using the eutectic of Au - Si, a heat treatment for several seconds is conducted in an inert gas at 400° to 500° C. As to the softening resistance, therefore, the tensile strength was measured after a heat treatment at 450° C. for 5 mins.

On the other hand, the aluminum-based alloy has to be subjected to a surface treatment before it is plated with Au, Ag or the like so that it may be well plated. In case the alloy is to be soldered, moreover, a preceding surface treatment will ensure a well soldering and avoid separation of the soldered portions. These preceding surface treatments generally involve the Ni or Cu plating, and the Zincate process is effective for the pretreatment of the plating. As the more homogenous is the distribution of Zn in the Zincate, the platability with Ni or Cu is improved the better so that the platability with Au or Ag and the solderability become the better. In this embodiment, therefore, the rolled strips were subjected to the Zincate process, and the distribution of Zn on the treated surface was observed with an optical microscope so as to judge the platability and the solderability. The order of homogeneity of the Zn distribution was evaluated by O, Δ and X. The distribution equivalent to or higher than Δ is judged to imply that the platability and the solderability are acceptable. Incidentally, the conditions for the Zincate process were as follows:
Bath Composition:
  NaOH 525 g/l;
  ZnO 98 g/l;
Bath Temperature:
  20° C.; and
  Dipping Time: 30 secs.

On the other hand, the bending repeatability was evaluated by bending a rolled strip of 0.30 mm repeatedly in one direction by 90 degrees and by measuring the number of reciprocations until the strip came into rupture. No problem in the bending repeatability arises if the number of reciprocations is 5 or more.

TABLE 1

| No. | Cu | Si | Fe | Mn | Mg | Cr | Zn | Zr | V | Ni | Ti | Al | Remarks |
|---|---|---|---|---|---|---|---|---|---|---|---|---|---|
| 1 | — | 0.10 | 0.10 | 1.0 | 2.0 | — | — | — | — | — | 0.01 | # | 1st Mode |
| 2 | — | 0.15 | 0.25 | 2.0 | 1.0 | — | — | — | — | — | 0.01 | # | " |
| 3 | 1.0 | 0.20 | 0.30 | 2.6 | 3.1 | — | — | — | — | — | 0.02 | # | 2nd Mode |
| 4 | — | 0.10 | 0.10 | 3.0 | 1.5 | — | 0.5 | — | — | — | 0.01 | # | " |
| 5 | — | 0.18 | 0.29 | 1.5 | 2.0 | 0.20 | — | — | — | — | 0.01 | # | 3rd Mode |
| 6 | — | 0.09 | 0.18 | 2.0 | 1.5 | — | — | 0.20 | — | — | — | # | " |
| 7 | — | 0.15 | 0.20 | 2.0 | 0.5 | — | — | — | 0.15 | — | 0.02 | # | " |
| 8 | — | 0.13 | 0.25 | 1.5 | 2.0 | — | — | — | — | 3.0 | 0.02 | # | " |
| 9 | 0.8 | 0.10 | 0.23 | 1.5 | 2.0 | 0.10 | — | 0.15 | — | — | — | # | 4th Mode |
| 10 | — | 0.15 | 0.30 | 2.0 | 2.0 | — | 1.0 | 0.15 | — | 1.5 | 0.01 | # | " |
| 11 | 0.6 | 0.12 | 0.28 | 2.5 | 1.0 | — | 1.5 | 0.15 | 0.20 | — | 0.01 | # | " |
| 12 | Fe—Ni (42%) Alloy | | | | | | | | | | | | 42 Alloy |

In Table 1:
: Remainder

TABLE 2

| Manu-facture | C | H | HT (°C.) | HRT (mm) | IAT (mm) | IAC | FA (mm) | FT (mm) |
|---|---|---|---|---|---|---|---|---|
| 1 | SCC | 500° C. × 2 Hrs | 480 | 3 | — | — | 150° C. × 1 Hr | 0.3 |
| 2 | CC | — | — | (Cast) 4 | — | — | 120° C. × 1 Hr | 0.3 |
| 3 | " | — | — | (Cast) 5 | 2.5 | CAF 500° C. FAC | 150° C. × 1 hr | 0.3 |

In Table 2:
C: Casting Method;
H: Homogenization;
HT: Heating Temperature;
HRT: Hot-Rolled Thickness;
IAT: Intermediate-Annealing Thickness;
IAC: Intermediate-Annealing Conditions;
FA: Final Annealing;
FT: Final Thickness;
SCC: Semi-Continuous Casting;
CAF: Continuous Annealing Furnace;
FAC: Forced Air Cooling; and
CC: Continuous Cooling.

TABLE 3

| Alloy No. | Manu-facture | TS (Kgf/mm$^2$) | SR(TSHT) (Kgf/mm$^2$) | BR Times | EC (IACS %) | H(P&S) | Remarks |
|---|---|---|---|---|---|---|---|
| 1 | 1 | 33.5 | 30.0 | 12 | 27 | Δ | Inven. |
| 2 | 2 | 37.4 | 31.1 | 11 | 22 | Δ | " |
| 3 | 2 | 43.2 | 32.0 | 11 | 19 | O | " |
| 4 | 2 | 38.5 | 31.9 | 9 | 17 | O | " |
| 5 | 1 | 40.5 | 32.1 | 10 | 21 | Δ | " |
| 6 | 2 | 39.3 | 33.2 | 9 | 22 | Δ | " |
| 7 | 2 | 35.2 | 31.0 | 10 | 21 | Δ | " |
| 8 | 2 | 47.0 | 34.5 | 11 | 24 | Δ | " |
| 9 | 3 | 46.7 | 34.1 | 10 | 24 | O | " |
| 10 | 2 | 48.5 | 35.1 | 10 | 20 | O | " |
| 11 | 2 | 45.2 | 31.0 | 12 | 21 | O | " |
| 11 | 3 | 49.5 | 37.8 | 11 | 18 | O | " |
| 12 | — | 45 | 45 | 14 | 3 | — | 42 Alloy |

In Table 3:
TS: Tensile Strength;
SR(TSHT): Softening Resistance (e.g., Tensile Strength after Heat Treatment of 450° C. × 5 Mins);
BR: Bending Repeatability;
EC: Electric Conductivity; and
H(P&S): Homogeneity (e.g., Platability & Solderability) of Zincate Zn.

As is apparent Table 3, the aluminum-based alloy for the conductive parts of an electronic or electric device according to the present invention has a sufficient tensile strength of 30 Kgf/mm$^2$ or higher and can still retain a tensile strength of 30 Kgf/mm$^2$ or higher even after the heat treatment of 450° C.×5 mins. As a result, the material of the present invention has such an excellent softening resistance as can be sufficiently applied to not only the die-bonding using the Pb - Sn solder at a low temperature but also the die-bonding using the Au - Si eutectic at a high temperature so that the material has excellent heat resistance. The material also has excellent bending repeatability. On the other hand, the material has an outstanding conductivity, as compared with that of the 42 alloy for the lead frame of the prior art, and excellent radiatability, thermal conductivity and electric conductivity, and contains Zn in an excellently homogenous state after the Zincate so that it is excellent in platability and solderability. Incidentally, the material has been confirmed to have excellent corrosion resistance in any case, although not enumerated in Table 3.

INDUSTRIAL APPLICABILITY

The material for the conductive parts of an electronic or electric device according to the present invention can be manufactured at a far lower cost than the 42 alloy, Koval or Cu system alloy of the prior art, and has excellent softening resistance, electric and thermal conductivities, radiatability, solderability and platability, high mechanical strength and excellent bending repeatability. Thus, the material of the present invention can find its most proper application to the material for the conductive parts of an electronic or electric device such as the lead frames, switches or connectors of various semiconductor elements such as ICs, SCRs required to have the above-specified properties. Especially, if the material of the present invention is to be applied to a lead frame in case the lead frame is wire-bonded with Al wires, the lead frame need not be plated at its element mounting or wire-connected portions with Au or Ag so that the cost for manufacturing the semiconductor elements can be further dropped.

We claim:

1. An electrical rolled strip of aluminum base alloy, consisting essentially of 0.3 to 4.0% by weight of manganese and 0.10 to 5.0% by weight of magnesium, the balance being aluminum, said electrical rolled strip having improved zincate processing, press forming, bending repeatability and etching properties.

2. An electrical rolled strip of aluminum base alloy, consisting essentially of 0.3 to 4.0% of maganese, 0.10 to 5.0% of magnesium, and at least one of 0.01 to 0.30% by weight of chromium, 0.01 to 0.30% by weight of zirconium, 0.01 to 0.30% by weight of vanadium, and 0.01 to 5.7% by weight of nickel, the balance being aluminum, said electrical rolled strip having improved zincate processing, press forming, bending repeatability and etching properties.

3. An electrical rolled strip of aluminum base alloy, consisting essentially of 0.3 to 4.0% by weight of manganese; 0.10 to 5.0% by weight of magnesium; and at least one of 0.01 to 3.0% by weight of copper and 0.01 to 3.0% by weight of zinc; and at least one of 0.01 to 0.30% by weight of chromium, 0.01 to 0.30% by weight of zirconium, 0.01 to 0.30% by weight of vanadium, and 0.01 to 5.7% by weight of nickel; the balance being aluminum, said electrical rolled strip having improved zincate processing, press forming, bending repeatability and etching properties.

4. An electrical rolled strip of aluminum base alloy, consisting essentially of 0.3 to 4.0% by weight of manganese, 0.10 to 5.0% by weight of magnesium, and 0.10 to 3.0 by weight of copper, the balance being aluminum, said electrical rolled strip having improved zincate processing, press forming, bending repeatability and etching properties.

5. An electrical rolled strip of aluminum base alloy, consisting essentially of 0.3 to 4.0% by weight of manganese, 0.10 to 5.0% by weight of magnesium, 0.01 to 3.0% by weight of copper, and 0.01 to 3.0% by weight of zinc, the balance being aluminum, said electrical rolled strip having improved zincate processing, press forming, bending repeatability and etching properties.

6. An electrical rolled strip according to claim 1, said electrical rolled strip having a thickness of from about 0.1 mm to about 0.5 mm.

7. An electrical rolled strip according to claim 1, said electrical rolled strip being in a form for lead frames, switch parts and connector parts.

8. An electrical rolled strip according to claim 2, said electrical rolled strip having a thickness of from about 0.1 mm to about 0.5 mm.

9. An electrical rolled strip according to claim 2, said electrical rolled strip being in a form selected from the group consisting of lead frames, switch parts and connector parts.

10. An electrical rolled strip according to claim 3, said electrical rolled strip having a thickness of from about 0.1 mm to about 0.5 mm.

11. An electrical rolled strip according to claim 3, said electrical rolled strip being in a form selected from the group consisting of lead frames, switch parts and connector parts.

12. An electrical rolled strip according to claim 4, said electrical rolled strip having a thickness of from about 0.1 mm to about 0.5 mm.

13. An electrical rolled strip according to claim 4, said electrical rolled strip being in a form selected from the group consisting of lead frames, switch parts and connector parts.

14. An electrical rolled strip according to claim 5, said electrical rolled strip having a thickness of from about 0.1 mm to about 0.5 mm.

15. An electrical rolled strip according to claim 5, said electrical rolled strip being in a form selected from the group consisting of lead frames, switch parts and connector parts.

* * * * *